(12) United States Patent
Chen et al.

(10) Patent No.: US 9,339,829 B2
(45) Date of Patent: May 17, 2016

(54) SPRAY COATING SYSTEM WITH CONSTANT PRESSURE AND STIRRING FUNCTION

(71) Applicants: Kuang-Yung Chen, Taoyuan County (TW); Chun-Ming Lai, Taoyuan County (TW); Chun-Liang Yang, Taoyuan County (TW)

(72) Inventors: Kuang-Yung Chen, Taoyuan County (TW); Chun-Ming Lai, Taoyuan County (TW); Chun-Liang Yang, Taoyuan County (TW)

(*) Notice: Subject to any disclaimer, the term of this patent is extended or adjusted under 35 U.S.C. 154(b) by 56 days.

(21) Appl. No.: 14/287,751

(22) Filed: May 27, 2014

(65) Prior Publication Data

US 2015/0298152 A1    Oct. 22, 2015

(30) Foreign Application Priority Data

Apr. 18, 2014 (TW) .............................. 103206865 U

(51) Int. Cl.
| | |
|---|---|
| *B05C 5/00* | (2006.01) |
| *B05B 9/04* | (2006.01) |
| *B05B 15/00* | (2006.01) |
| *H01L 33/00* | (2010.01) |
| *B05B 1/30* | (2006.01) |

(52) U.S. Cl.
CPC . *B05B 9/04* (2013.01); *B05B 9/042* (2013.01); *B05B 15/002* (2013.01); *H01L 33/00* (2013.01); *B05B 1/3046* (2013.01); *B05B 15/003* (2013.01)

(58) Field of Classification Search
USPC ................... 118/300, 302; 222/309; 366/273; 417/474, 475, 477, 479
See application file for complete search history.

(56) References Cited

U.S. PATENT DOCUMENTS

| | | | | |
|---|---|---|---|---|
| 4,034,700 A | * | 7/1977 | Bassett ................. | G01N 1/312 118/100 |
| 5,480,487 A | * | 1/1996 | Figini .................... | B05C 11/10 118/610 |
| 5,985,535 A | * | 11/1999 | Urabe .................... | B01F 7/166 366/273 |
| 2004/0022123 A1 | * | 2/2004 | Coville ............... | B01F 13/0818 366/273 |
| 2005/0028731 A1 | * | 2/2005 | Lindholm ............... | C03C 25/18 118/400 |

* cited by examiner

*Primary Examiner* — Yewebdar Tadesse
(74) *Attorney, Agent, or Firm* — WPAT, P.C.; Justin King

(57) ABSTRACT

The present invention discloses a spray coating system with constant pressure and stirring function. The spray coating system comprises a stirring barrel containing a mixture material, a stirrer stirring the mixture material, a control valve used for controlling a spray rate of the packaging material, a nozzle connected to the control valve for spouting the packaging material in spray form, a circulation pipe line connected between the stirring barrel and the control valve and a peristaltic pump mounted at the circulation pipe line. Thereby, the spray coating system is applied to the dispensing process of the LED to stir the packaging material and spout the packaging material in spray form, and can transmit the packaging material remained back to the stirring barrel by the peristaltic pump for avoiding the extraneous entering to the packaging material and blocking the nozzle to advance the spray coating quality and efficiency.

18 Claims, 3 Drawing Sheets

SPRAY COATING SYSTEM WITH CONSTANT PRESSURE AND STIRRING FUNCTION

BACKGROUND OF THE INVENTION

1. Field of the Invention

This invention generally relates to a spray coating system with constant pressure, and more particularly, to a spray coating system with constant pressure which uses the magnetic induction effect to perform the stirring function.

2. Description of the Prior Art

The traditional packaging process of light emitter diode (LED) mainly comprises: chip inspection, wafer expending, dispensing (backing adhesive operation), manual wafer probing or automatic mounting bracket, sintering, bonding, packaging, curing, cutting and testing, etc. Specifically, in the process of dispensing, the paste dispenser is used to drip the adhesive on corresponding locations of the LED brackets after mixing the epoxy resin with the phosphor or the silver powder according to the proper proportion. Next, the manual wafer probing or the automatic mounting bracket is performed. The traditional dispensing process has the advantages of low cost and big quantity, and its disadvantage is more difficult to control the dispensing rate. Because many detailed requirements about the phosphor distribution ratio, the adhesive height, the dispensing location and the likes need to be noticed, it will generate many problems if not follow these detailed requirements, for example, color from LED non-uniform, color temperature difference, or the color from LED looks too much yellow because adding too much the phosphor, or the color from LED looks too much blue because adding too less the phosphor.

Thereby, the dispensing process improved is applied to perform the spray coating operation. The spray coating operation is performed by the automatic spray coating device after mixing the sold formulation (the phosphor or silver powder) and mixture (the epoxy resin) to generate the mixture material according to the specified proportion. The advantage of the dispensing process improved is that the coating thickness can be easily controlled, and the execution speed is faster than the tradition dispensing process. However, the dispensing process improved easily leads to remain or accumulate the mixture material in the nozzle to block the nozzle or make the composition heterogeneity of the packaging material so as to affect the product quality and the spray coating process.

Moreover, there is a dispensing process using the motor's blades to stir and mix the sold formulation (the phosphor or silver powder) and mixture (the epoxy resin) to generate the mixture material according to the proper proportion, so as to perform the spray coating operation by the automatic spray coating device with the motor's blades. The advantage is that the dispensing process applying the motor's blade can not easily lead to remain or accumulate the mixture material in the nozzle to block the nozzle or make the composition heterogeneity of the packaging material, and therefore, the composition of packaging material will be uniform distribution, and not block the nozzle. However, the dispensing process with the motor's blade will easily bring the pollutant or the extraneous matter into the packaging material when operating the motor's blade, so as to pollute the packaging material and affect the spray coating quality.

For the reason that the conventional spray coating system could not avoid the extraneous matter entering to the packaging material, a need has arisen to propose a novel scheme that may adaptively avoid the extraneous entering to the packaging material for preventing to pollute the packaging material, block the nozzle, generate the composition heterogeneity of the packaging material so as to advance the spray coating quality and efficiency.

SUMMARY OF THE INVENTION

In view of the foregoing, it is an object of the present invention to provide a spray coating system with constant pressure and stirring function. The spray coating system comprises: a stirring barrel, containing a mixture material; a stirrer, connected to the stirring barrel, stirring the mixture material in the stirring barrel; a control valve, having a cavity body used to contain the mixture material; a nozzle, connected to the cavity body, mixing the mixture material and a gas pressed and spouting the mixture material mixed in spray form; a peristaltic pump, pumping the mixture material remained in the cavity body back to the stirring barrel after spouting; and a circulation pipe line, connected between the stirring barrel, the cavity body of the control valve and the peristaltic pump.

Preferably, the stirring barrel further connects to a gas pressurization pipe, the gas pressurization pipe is connected to a gas pressurization device, and the gas pressurization device is used for pressing a gas into the stirring barrel through the gas pressurization pipe so as to transmit the mixture material in the stirring barrel into the cavity body of the control valve. Moreover, the pressurization pipe or the gas pressurization device has an adjusting valve used for adjusting a gas flow rate.

Preferably, the stirrer further has a driving device and a stirring knife connected to the driving device, and the stirring knife is extended into the stirring barrel inside.

Preferably, the stirrer further has a driving device and a magnetic stick inducing the driving device by a magnetic induction effect, and the magnetic stick is mounted in the stirring barrel, wherein the magnetic stick is the sharp of a circular, a ellipse, a disc, a cruciform, a star or a polygon. Moreover, the driving device is a magnetic driving device.

Preferably, the control valve is a needle valve which uses a needle as a control switch.

Preferably, the peristaltic pump is mounted between an output location of the stirring barrel and the control valve.

Preferably, the peristaltic pump is mounted between an output location of the control valve and the stirring barrel.

Preferably, the peristaltic pump further comprises a flexible tube and a pump driving device, and the flexible tube is connected to the circulation pipe line, wherein the pump driving device further comprises a rotator, a rotor connected to the rotator for pressing the flexible tube, and a drive motor used for turning the rotator.

Based on one object of the present invention, a spray coating system with constant pressure and stirring function is disclosed according to one embodiment of the present invention. The spray coating system comprises: a stirring barrel, containing a packaging material; a stirrer, connected to the stirring barrel, stirring the packaging material in the stirring barrel; a control valve, having a cavity body used for containing the packaging material; a nozzle, connected to the cavity body of the control valve, mixing the mixture material and a gas pressed and spouting the mixture material mixed in spray form; a circulation pipe line, comprising a first pipe line and a second pipe line, wherein the first pipe line is connected to the stirring barrel and the cavity body of the control valve for transmitting the packaging material in the stirring barrel into the cavity body of the control valve, and the second pipe line is connected to the cavity body of the control valve and the stirring barrel for transmitting the packaging material remained in the cavity body back to the stirring barrel after spouting; and a peristaltic pump, mounted at the circulation pipe line, pumping the mixture material remained in the cavity body back to the stirring barrel.

Preferably, the stirring barrel further connects to a gas pressurization pipe, the gas pressurization pipe is connected to a gas pressurization device, and the gas pressurization device is used for pressing a gas into the stirring barrel through the gas pressurization pipe so as to transmit the mixture material in the stirring barrel into the cavity body of the control valve. Moreover, the pressurization pipe or the gas pressurization device has an adjusting valve used for adjusting a gas flow rate.

Preferably, the stirrer further has a driving device and a stirring knife connected to the driving device, and the stirring knife is extended into the stirring barrel inside.

Preferably, the stirrer further has a driving device and a magnetic stick inducing the driving device by a magnetic induction effect, and the magnetic stick is mounted in the stirring barrel, wherein the magnetic stick is the sharp of a circular, a ellipse, a disc, a cruciform, a star or a polygon. Moreover, the driving device is a magnetic driving device.

Preferably, the control valve is a needle valve which uses a needle as a control switch.

Preferably, the peristaltic pump is mounted at the first pipe line.

Preferably, the peristaltic pump is mounted at the second pipe line.

Preferably, the peristaltic pump further comprises a flexible tube and a pump driving device, and the flexible tube is connected to the circulation pipe line, wherein the pump driving device further comprises a rotator, a rotor connected to the rotator for pressing the flexible tube, and a drive motor used for turning the rotator.

BRIEF DESCRIPTION OF THE DRAWINGS

The accompanying drawings incorporated in and forming a part of the specification illustrate several aspects of the present invention, and together with the description serve to explain the principles of the disclosure. In the drawings.

DETAILED DESCRIPTION OF THE PREFERRED EMBODIMENTS

Some embodiments of the present invention will now be described in greater detail. Nevertheless, it should be noted that the present invention can be practiced in a wide range of other embodiments besides those explicitly described, and the scope of the present invention is expressly not limited except as specified in the accompanying claims.

Moreover, some irrelevant details are not drawn in order to make the illustrations concise and to provide a clear description for easily understanding the present invention.

Figure 1:
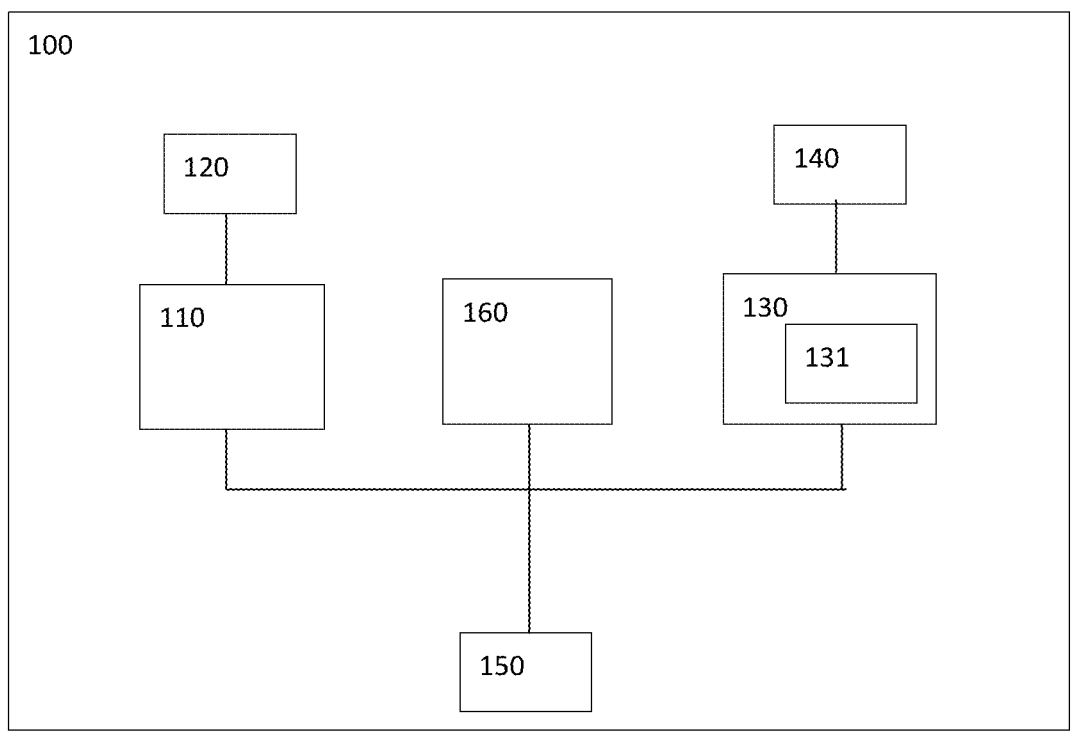
FIG. 1 shows a block diagram of a spray coating system with constant pressure and stirring function according to one embodiment of the present invention.

Referring to FIG. 1, which illustrates a spray coating system 100 with constant pressure and stirring function according to one embodiment of the present invention. The spray coating system 100 with constant pressure and stirring function comprises: a stirring barrel 110, a stirrer 120, a control valve 130, a nozzle 140, a circulation pipe line 150 and a peristaltic pump 160. Specifically, the stirring barrel 110 is a container, which contains a mixture material connects to an external gas pressurization device (not shown in). The gas is pressed into the stirring barrel 110 by using the gas pressurization device so as to press the mixture material in the stirring barrel 110 into the control valve 130. The stirrer 120 is assembly coupled to a predefined location of the stirring barrel 110 for stirring the mixture material in the stirring barrel 110.

The control valve 130 has a cavity body 131 used for containing the mixture material from the stirring barrel 110 so as to spray out the mixture material from the cavity body 131. The nozzle 140 is connected to the cavity body 131 in the control valve 130 for mixing the gas pressed and the mixture material so as to allow spouting the material mixed of the nozzle in spray form.

The circulation pipe line 150 connects to the stirring barrel 110, the control valve 130 and the peristaltic pump 160, and transmits the mixture material remained back to the stirring barrel 110.

The peristaltic pump 160 is mounted at the circulation pipe line 150 for pumping the mixture material remained in the cavity body 131 back to the stirring barrel 110.

As shown in FIG. 1, the spray coating system 100 of the present invention may inject the mixture material liquid into the stirring barrel 110, and use the stirrer 120 to stir the mixture material liquid for achieving the hybrid equilibrium. Then, the external gas pressurization device presses the gas into the stirring barrel 110 so as to press the mixture material in the stirring barrel 110 into the cavity body 131 of the control valve 130, and the nozzle 140 spouts the mixture material in spray form. However, the mixture material in the cavity body 131 can not be completely exhausted at once in spraying process, and meanwhile the peristaltic pump 160 pumps the mixture material remained in the cavity body 131 or the nozzle 140 to the circulation pipe line 150, and then the mixture material remained is transmitted back into the stirring barrel 110.

Figure 2:
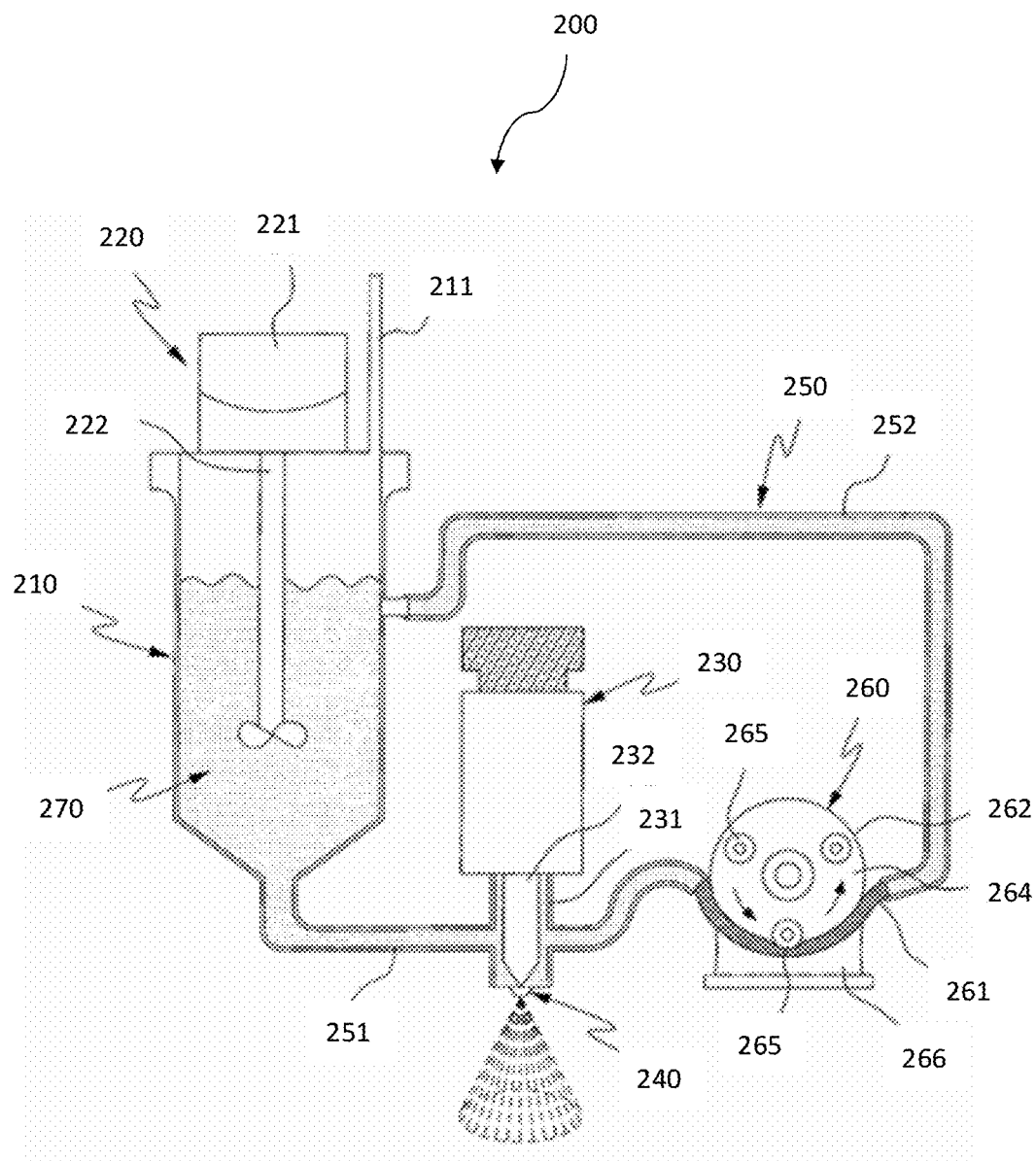
FIG. 2 shows a structure diagram of a spray coating system with constant pressure and stirring function according to one embodiment of the present invention.

Referring to FIG. 2, which illustrates a spray coating system 200 with constant pressure and stirring function according to one embodiment of the present invention. The spray coating system 200 with a constant pressure and a stirring function comprises: a stirring barrel 210, a stirrer 220, a control valve 230, a nozzle 240, a circulation pipe line 250 and a peristaltic pump 260. Specifically, the stirring barrel 210 is a container, which contains a packaging material 270 connects to a gas pressurization pipe 211 connected to an external gas pressurization device (not shown in). The gas is pressed into the stirring barrel 110 through the gas pressurization pipe 211 by using the gas pressurization device so as to allow pressing the packaging material 270 in the stirring barrel 210 into the control valve 230. Specifically, the gas pressurization pipe 211 or the gas pressurization device may have an adjusting valve (not shown in) used for adjusting the gas flow rate, and the quantitative packaging material 270 is pressed into the control valve 230 by using the adjusting valve. The stirrer 220 is assembly coupled to a predefined location of the stirring barrel 210 for stirring the packaging material 270 in the stirring barrel 210. The stirrer 220 is assembly coupled to a predefined location of the stirring barrel 210 for stirring the mixture material in the stirring barrel 210. In the preferred embodiment, the stirrer 220 has a driving device 221 connects to the stirrer 210 and a stirring knife 222 connecting to the driving device 221. Specifically, the driving device 221 may be a motor or other device that can generate the power, and the stirring knife 222 is extended to the stirring barrel 210 inside for stirring the packaging material 270 in the stirring barrel 210.

The control valve 230 has a cavity body 231 containing the packaging material 270 from the stirring barrel 210 so as to spray out the packaging material 270 from the cavity body 231. In the preferred embodiment, the control valve 230 may be a needle valve using a needle 232 as a control switch or other kind of valve. The nozzle 240 is connected to the cavity body 231 of the control valve 230 so as to allow spouting the mixed material which mixes the packaging material 270 and the gas pressed in spray form, and perform the dispensing process for the LED via the spray coating operation.

The circulation pipe line 250 comprises a first pipe line 251 and a second pipe line 252, and the first pipe line 251 is connected between the stirring barrel 210 and the cavity body 231 of the control valve 230 for transmitting the packaging material 270 in the stirring barrel 210 into the cavity body 231 of the control valve 230; the second pipe line 252 is connected between the cavity body 231 of the control valve 230 and the stirring barrel 210 for transmitting the packaging material 270 remained in the cavity body 231 back to the stirring barrel 210.

The peristaltic pump 260 may mount at the first pipe line 251 or the second pipe line 252 for pumping the packaging material 270 in the cavity body 231 back to the stirring barrel 210. In the preferred embodiment, the peristaltic pump 260 comprises a flexible tube 261 and the pump driving device 262. The flexible tube 261 may connect to the first pipe line 251 or the second pipe line 252 for keeping the packaging material 270 flow smoothly and be clear by pressing the flexible tube 261. The pump driving device 262 has a rotator 264, at least one rotor 265 which is connected to the rotator 264 so as to press the flexible tube 261 (as shown in three rotors 265), and a drive motor 266 used for driving and turn the rotator 264. The rotators 265 presses the flexible tube 261 to pump the packaging material 270 back to the stirring barrel 210 when turning the rotator 264.

As shown in FIG. 2, the spray coating system 200 of the present invention may inject the packaging material 270 liquid into the stirring barrel 210, for example, the liquid epoxy resin, the phosphor, the silver powder or other material, and use the stirring knife 222 of the stirrer 220 to stir the packaging material 270 for achieving the hybrid equilibrium. Then, the external gas pressurization device presses the gas into the stirring barrel 210 through the gas pressurization pipe 211 so as to press the mixture material 270 in the stirring barrel 210 into the cavity body 231 of the control valve 230, and the nozzle 240 spouts the mixture material which mixes the gas pressed and the packaging material 270 in spray form so as to perform the dispensing process for the LED via the spray coating operation. However, the cavity body 231 of the control valve 230 can not be completely exhausted in spraying process at once, and meanwhile the peristaltic pump 260 pumps the packaging material 270 remained in the cavity body 231 or the nozzle 240 to the second pipe line 252 of the circulation pipe line 250 by driving the rotors 265 of the driving device 262 so as to press the flexible tube 261, and then the packaging material 270 remained is transmitted back into the stirring barrel 210 through the second pipe line 252.

Figure 3:
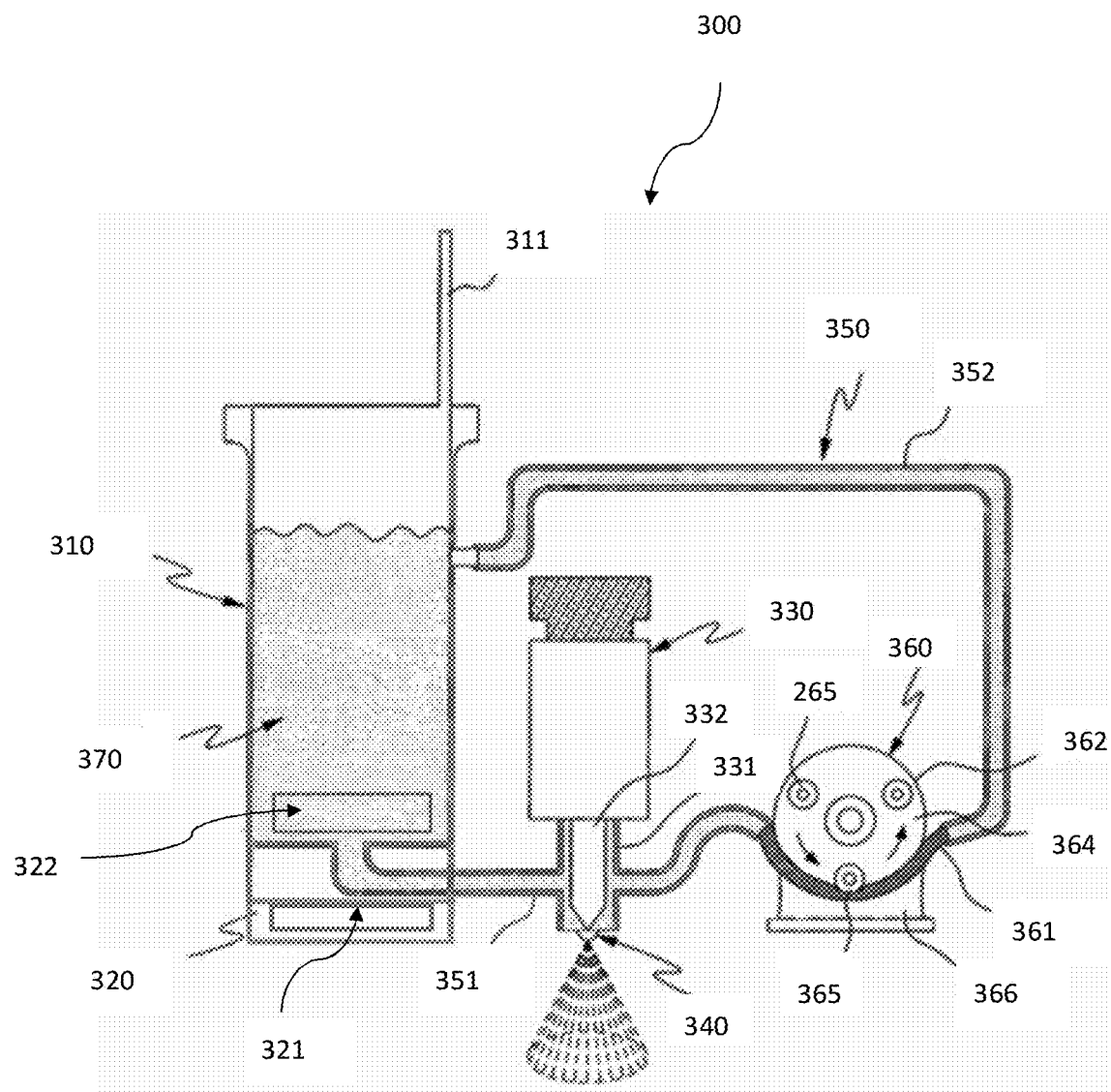
FIG. 3 shows a structure diagram of a spray coating system with constant pressure and stirring function according to another embodiment of the present invention.

Referring to FIG. 3, which illustrates a spray coating system 300 with constant pressure and stirring function according to another embodiment of the present invention. The spray coating system 300 with a constant pressure and a stirring function comprises: a stirring barrel 310, a stirrer 320, a control valve 330, a nozzle 340, a circulation pipe line 350 and a peristaltic pump 360. Specifically, the stirring barrel 310 is a container, which contains a packaging material 370 connects to a gas pressurization pipe 311 connected to an external gas pressurization device (not shown in). The gas is pressed into the stirring barrel 310 through the gas pressurization pipe 311 by using the gas pressurization device so as to allow pressing the packaging material 370 in the stirring barrel 310 into the control valve 330. Specifically, the gas pressurization pipe 311 or the gas pressurization device may have an adjusting valve (not shown in) used for adjusting the gas flow rate, and the quantitative packaging material 370 is pressed into the control valve 330 by using the adjusting valve. The stirrer 320 is assembly coupled to a predefined location of the stirring barrel 310 for stirring the packaging material 370 in the stirring barrel 310. In the preferred embodiment, the stirrer 320 has a driving device 321 connected to the stirrer 310 and a magnetic stick 322 mounted in the stirring barrel 310 for using the magnetic induction effect to induce the driving device 321. In other words, the driving device 321 drives the magnetic stick 322 by the magnetic induction so as to stir the packaging material 270 in the stirring barrel 310 by the magnetic stick 322.

The control valve 330 has a cavity body 331 containing the packaging material 370 from the stirring barrel 310 so as to spray out the packaging material 370 from the cavity body 331. In the preferred embodiment, the control valve 330 may be a needle valve using a needle 332 as a control switch or other kind of valve. The nozzle 340 is connected to the cavity body 331 of the control valve 330 so as to allow spouting the mixed material which mixes the packaging material 370 and the gas pressed in spray form, and perform the dispensing process for the LED via the spray coating operation.

The circulation pipe line 350 comprises a first pipe line 351 and a second pipe line 352, and the first pipe line 351 is connected between the stirring barrel 310 and the cavity body 331 of the control valve 330 for transmitting the packaging material 370 in the stirring barrel 310 into the cavity body 331 of the control valve 330; the second pipe line 352 is connected between the cavity body 331 of the control valve 330 and the stirring barrel 310 for transmitting the packaging material 370 remained in the cavity body 331 back to the stirring barrel 310.

The peristaltic pump 360 may mount at the first pipe line 351 or the second pipe line 352 for pumping the packaging material 370 remained in the cavity body 331 back to the stirring barrel 310. In the preferred embodiment, the peristaltic pump 360 comprises a flexible tube 361 and the pump driving device 362. The flexible tube 361 may connect to the first pipe line 351 or the second pipe line 352 for keeping the packaging material 370 flow smoothly and be clear by pressing the flexible tube 361. The pump driving device 362 has a rotator 364, at least one rotor 365 which is connected to the rotator 364 so as to press the flexible tube 361 (as shown in three rotors 365), and a drive motor 366 used for driving and turn the rotator 364. The rotators 365 presses the flexible tube 361 to pump the packaging material 370 back to the stirring barrel 310 when turning the rotator 364.

As shown in FIG. 3, the spray coating system 300 of the present invention may inject the packaging material 370 liquid into the stirring barrel 310, for example, the liquid epoxy resin, the phosphor, the silver powder or other material, and use the magnetic stick 322 of the stirrer 320 to stir the packaging material 370 for achieving the homogeneous mixing. Then, the external gas pressurization device presses the gas into the stirring barrel 310 through the gas pressurization pipe 311 so as to press the packaging material 370 in the stirring barrel 310 into the cavity body 331 of the control valve 330, and the nozzle 340 spouts the mixture material which mixes the gas pressed and the packaging material 370 in spray form so as to perform the dispensing process for the LED via the spray coating operation. However, the mixture material in the cavity body 331 of the control valve 330 can not be completely exhausted at once in spraying process, and meanwhile the peristaltic pump 360 pumps the packaging material 370 remained in the cavity body 331 or the nozzle 340 to the second pipe line 352 of the circulation pipe line 350 by driving the rotors 365 of the pump driving device 362 so as to press the flexible tube 361, and then the packaging material 370 remained is transmitted back into the stirring barrel 310 through the second pipe line 352.

Although specific embodiments have been illustrated and described, it will be obvious to those skilled in the art that various modifications may be made without departing from what is intended to be limited solely by the appended claims.

What is claimed is:

1. A spray coating system with constant pressure and stirring function, comprising:
    a stirring barrel, containing a mixture material;
    a stirrer, connected to the stirring barrel, stirring the mixture material in the stirring barrel;
    a control valve, having a cavity body used to contain the mixture material;
    a nozzle, connected to the cavity body, mixing the mixture material and a gas pressed and spouting the mixture material mixed in spray form;
    a peristaltic pump, pumping the mixture material remained in the cavity body back to the stirring barrel after spouting; and
    a circulation pipe line, connected between the stirring barrel, the cavity body of the control valve and the peristaltic pump, wherein the peristaltic pump is mounted between an output location of the control valve and the stirring barrel.

2. The spray coating system according to claim 1, wherein the stirring barrel further connects to a gas pressurization pipe, the gas pressurization pipe is connected to a gas pressurization device, and the gas pressurization device is used for the gas pressed into the stirring barrel through the gas pressurization pipe so as to transmit the mixture material in the stirring barrel into the cavity body of the control valve.

3. The spray coating system according to claim 2, wherein the pressurization pipe or the gas pressurization device has an adjusting valve used for adjusting a gas flow rate.

4. The spray coating system according to claim 1, wherein the stirrer further has a driving device and a stirring knife connected to the driving device, and the stirring knife is extended into the stirring barrel inside.

5. The spray coating system according to claim 1, wherein the stirrer further has a driving device and a magnetic stick inducing the driving device by a magnetic induction effect, and the magnetic stick is mounted in the stirring barrel, wherein the magnetic stick is the shape of a circular, a ellipse, a disc, a cruciform, a star or a polygon.

6. The spray coating system according to claim 5, wherein the driving device is a magnetic driving device.

7. The spray coating system according to claim 1, wherein the control valve is a needle valve which uses a needle as a control switch.

8. The spray coating system according to claim 1, wherein the peristaltic pump is mounted between an output location of the stirring barrel and the control valve.

9. The spray coating system according to claim 1, wherein the peristaltic pump further comprises a flexible tube and a pump driving device, and the flexible tube is connected to the circulation pipe line, wherein the pump driving device further comprises a rotator, a rotor connected to the rotator for pressing the flexible tube, and a drive motor used for turning the rotator.

10. A spray coating system with constant pressure and stirring function, comprising:
    a stirring barrel, containing a packaging material;
    a stirrer, connected to the stirring barrel, stirring the packaging material in the stirring barrel;
    a control valve, having a cavity body used for containing the packaging material;
    a nozzle, connected to the cavity body of the control valve, mixing the mixture material and a gas pressed and spouting the mixture material mixed in spray form;
    a circulation pipe line, comprising a first pipe line and a second pipe line, wherein the first pipe line is connected to the stirring barrel and the cavity body of the control valve for transmitting the packaging material in the stirring barrel into the cavity body of the control valve, and the second pipe line is connected to the cavity body of the control valve and the stirring barrel for transmitting the packaging material remained in the cavity body back to the stirring barrel after spouting; and
    a peristaltic pump, mounted at the circulation pipe line, pumping the mixture material remained in the cavity body back to the stirring barrel, wherein the peristaltic pump is mounted at the second pipe line.

11. The spray coating system according to claim 10, wherein the stirring barrel further connects to a gas pressurization pipe, the gas pressurization pipe is connected to a gas pressurization device, and the gas pressurization device is used for the gas pressed into the stirring barrel through the gas pressurization pipe so as to transmit the mixture material in the stirring barrel into the cavity body of the control valve.

12. The spray coating system according to claim 11, wherein the pressurization pipe or the gas pressurization device has an adjusting valve used for adjusting a gas flow rate.

13. The spray coating system according to claim 10, wherein the stirrer further has a driving device and a stirring knife connected to the driving device, and the stirring knife is extended into the stirring barrel inside.

14. The spray coating system according to claim 10, wherein the stirrer further has a driving device and a magnetic stick inducing the driving device by a magnetic induction effect, and the magnetic stick is mounted in the stirring barrel, wherein the magnetic stick is the sharp of a circular, a ellipse, a disc, a cruciform, a star or a polygon.

15. The spray coating system according to claim 14, wherein the driving device is a magnetic driving device.

16. The spray coating system according to claim 10, wherein the control valve is a needle valve which uses a needle as a control switch.

17. The spray coating system according to claim 10, wherein the peristaltic pump is mounted at the first pipe line.

18. The spray coating system according to claim 10, wherein the peristaltic pump further comprises a flexible tube and a pump driving device, and the flexible tube is connected to the circulation pipe line, wherein the pump driving device further comprises a rotator, a rotor connected to the rotator for pressing the flexible tube, and a drive motor used for turning the rotator.

* * * * *